that the piston pin 014 is now forced by the V-shaped spring 136 (FIG. 20) to follow the helicoid slit 132 in the guide cylinder 13, that the bit 05 remains keyed to the sleeve 07 via the bush 150 with key 157 and that the sleeve pins 071 and 072 (FIG. 18) have been disengaged from the forks 165 and 166 of the coupling cylinder 161 which moved backwards due to the action of spring 152. FIG. 9 shows the bit and sleeve in the rest position but rotated over 180° so that the cut-out portion 073 of the sleeve and the widened longitudinal groove 056 of the bit are in the positions shown. The reason of this rotation will become clear below.

During the backward movement of the wire feeding piston 200 the jaws 205 and 205' relax and the telescopic tube arrangement 210 is pulled out.

3RD OPERATIONS SEQUENCE (FIGS. 10 TO 12)

The tool 1 is now moved towards the second terminal 234 (FIG. 10) to be wrapped in order to provide enough wire length necessary for the interconnection of the first 233 and second 234 terminals. During this tool displacement the insulated wire 231 is disengaged from the helical slit of the sleeve as shown. The trigger 195 is pulled a third time whereby pressurized air is fed to the piston 265 of the wire cutting mechanism 25 via conduit 263. After a time interval T3 during which the wire cutting mechanism operates (FIG. 10) the pressurized air is shut off and the cutting knife 250 returns to its initial position. Immediately thereafter and during a time interval T'3 pressurized air is admitted to the double acting piston 01 via the conduit 103 as explained in the 1st operations sequence. The piston (01) and bit (05) are again moved in forward direction thereby effectuating a translational movement. During this translational movement the guide pin 014 of the piston 01 is guided in the second straight slit 131 of the guide cylinder 13 (FIG. 20). The forward movement of the bit is shown in FIG. 11 and this time the insulated wire portion 13 is skinned and this skinned wire portion is lodged in the longitudinal groove 050 of the bit 05 after the second skinning operation (FIG. 12). It is obvious that the longitudinal groove 050 and the cut-out portion 074 must necessarily be situated on the left side and therefore to rotate both the bit and sleeve over an angle of 180° since with the above groove and cut-out portion on the opposite side it would be impossible to carry out the second skinning operation. Moreover, with the sleeve slit 070 on the left side as in the previous cases the wire portion 13 would engage therein during the forward movement of the bit. FIG. 12 shows the bit, the sleeve 07 and skinned wire portion 13. The corresponding position of the clutch mechanism 15 is shown in FIG. 19.

Since the piston has been rotated over 180° the three teeth 017, 018 and 019 now engage with the teeth 162, 163 and 164 of the coupling cylinder 161.

Consequently this coupling cylinder 161 and bush 150 remain in their rest position. Due to this the sleeve is not coupled to the housing as explained before since the forks 165 and 166 do not engage with the sleeve pins 072 and 071 but the sleeve is now keyed to the bit via key 157 and bush 150.

4TH OPERATIONS SEQUENCE (FIG. 13)

Prior to the second wrapping operation the tool is positioned over the terminal 234 to be wrapped. The trigger 195 is pulled a fourth time whereby pressurized air is admitted to the motor 04 via the conduit 116 and piston hole 016 for a time interval T4 during which the second wrapping operation is carried out (FIG. 13). After the time interval T4 the air supply is again shut off and the stop mechanism 040 stops the bit at its start position i.e. with the longitudinal groove 050 on the left side.

It should be noted that during this second wrapping operation the bit and sleeve rotate simultaneously since they are keyed together as explained above. This simultaneous rotation of the bit and sleeve prevents the skinned wire portion to project into the helical slit 070 of the sleeve during this second wire wrapping operation. This would have been the case if the sleeve had been maintained motionless. After the above time interval T4 and during a time interval T'4 pressurized air supplied via the conduit 115 moves the piston 01 and bit 05 again backwards toward their rest position but during this backward movement this position with bit 05 and sleeve 07 are again rotated over an angle of 180° in the same direction a as above. In this rest position the bit and sleeve are again in their initial position ready to make a new first wrapping (FIG. 4). It should be noted that the above mentioned rotation over 180° is due to the fact that the piston pin 014 is now urged by the V-shaped spring 137 to follow the helical slit 133 in the guide cylinder 13 and that during this backward movement the bit and sleeve are keyed together.

While the principles of the invention have been described above in connection with specific apparatus, it is to be clearly understood that this description is made only by way of an example and not as a limitation on the scope of the invention.

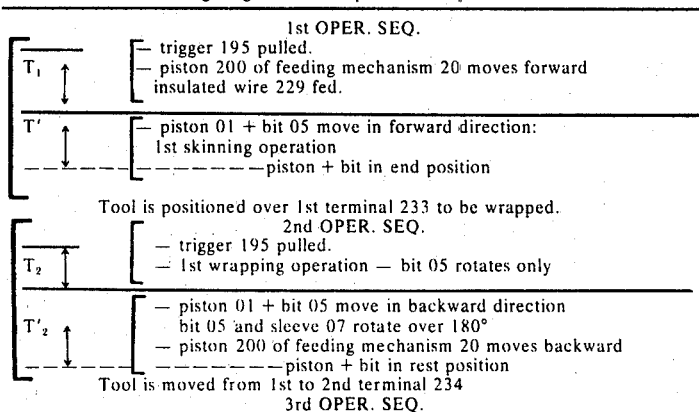

CONTROL SYSTEM FOR BATTERY PLATE STACKING APPARATUS

BACKGROUND OF THE INVENTION

This invention relates to a control system for stacking apparatus used in the manufacture of storage batteries, and particularly lead-acid type storage batteries. Such batteries typically include a battery case containing one or more battery elements immersed in a suitable electrolyte such as sulfuric acid. The battery elements generally comprise a plurality of alternate positive and negative battery plates each of which are separated by a sheet of electrically insulating material commonly referred to as a separator. Conventional practice has been to form the battery elements with one more negative plate than the number of positive plates so that the end most plates of each element are negative plates. The battery elements thus contain an odd number of plates which may vary in number depending on the design of the battery itself. Recently consideration has also been given to utilization of battery elements having equal numbers of positive and negative plates.

Conventional battery stacking apparatus for forming the battery elements are well known in the art. Examples include U.S. Pat. No. 2,908,377 issued Oct. 13, 1959 to H. C. Winkle el al.; U.S. Pat. No. 2,897,950 issued Aug. 4, 1959 to L. G. Reed; U.S. Pat. No. 2,790,536 issued Apr. 30, 1957 to L. G. Reed; and U.S. Pat. No. 2,652,933 issued Sept. 22, 1953 to A. R. Willard et al., as well as U.S. patent application Ser. No. 566,975 filed Apr. 10, 1975 in the name of the present applicant and assigned to the assignee of the present application. A conventional stacking apparatus generally includes a plurality of dispensers for depositing positive and negative battery plates and battery separators on a conveying device for further processing. Typically, partial battery elements, or books, may be formed which comprise an even number of positive and negative plates and separators which books may be combined in a common stack to make up a battery element. Provision must also be made for dispensing an odd or last negative plate to form a conventional battery element as previously mentioned. In the case of an even numbered battery element, a last negative plate is not used nor is the last separator used. A typical prior art stacking apparatus generally includes a mechanical system comprising gears, cams and/or ratchet mechanisms for determining the appropriate point in time at which the last negative plate should be dispensed. Such mechanical control systems often act to limit the speed at which the apparatus could be operated. Additionally, the mechanical type control systems are sometimes limited in the total number of plates which may be selected to comprise a complete battery element. In recent years, improvements in the equipment used in the battery industry have made it possible to process and handle thinner battery plates which in turn makes it possible to form battery elements of larger numbers of battery plates. In some cases the mechanical control apparatus may be limited in its capability to provide such increased numbers of battery plates and elements. Furthermore, prior art systems are not easily adapted to manufacture even numbered battery elements.

SUMMARY OF THE INVENTION

It is an object of the present invention to provide an improved electrical control system for a battery stacking apparatus.

Another object of the invention is to provide an electrical control system for a battery stacking apparatus which may be easily adjusted to selectively determine the total number of positive and negative battery plates to be included in a battery element.

Other objects and advantages of the invention will be apparent from a description of the preferred embodiment which follows.

The invention basically comprises an electrical control system for a battery stacking apparatus which includes a first counter for determining the number of cycles of the apparatus over a given period of time. The first counter may be adjusted to selectively actuate a dispenser for dispensing a last negative plate after a predetermined number of cycles. A second counter may be provided for monitoring the number of books formed or cycles occurring after activation of the last negative dispensing device so that each battery element contains a preselected number of books prior to transfer for further processing.

DESCRIPTION OF A PREFERRED EMBODIMENT

Figure 1:
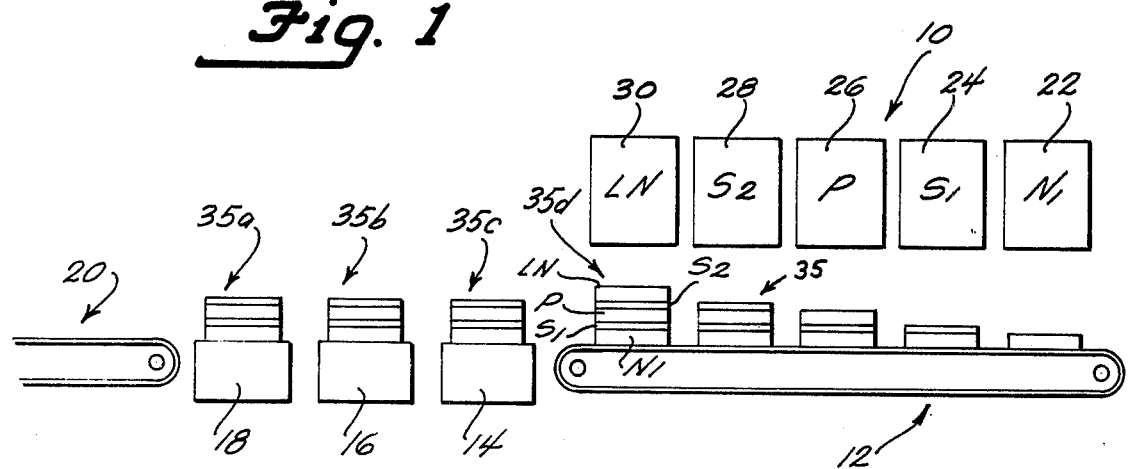
FIG. 1 schematically depicts a conventional battery stacking apparatus.

FIG. 1 schematically depicts a typical stacking apparatus such as are described in the previously mentioned U.S. patents. The stacking apparatus generally includes a plate and separator dispensing station 10 which is positioned over a transfer conveyor 12 for receiving battery plates and separators in the form of books which are transferred to a holding device 14. A transfer mechanism 16 may be provided for transferring the books from the holding station 14 to a shuttle station, or kicker, 18 where the books of plates are combined to form a battery element after which they are transferred by the kicker 18 to an output conveyor 20. The dispensing station 10 includes a plurality of plate and separator dispensers positioned over the conveyor 12. Starting from the upstream end of conveyor 12, a first or $N_1$ plate dispenser 22 is provided for dispensing a first negative or $N_1$ plate onto conveyor 12. Proceeding downstream over the conveyor 12, is a first or $S_1$ separator dispenser 24 for dispensing a first or $S_1$ separator onto previously deposited $N_1$ plates on conveyor 12. Similarly, a positive battery plate or P dispenser 26 and a second or $S_2$ separator dispenser 28 are provided for adding a positive plate P and separator $S_2$ to form a book.

A last negative or LN dispenser 30 is provided for selectively dispensing a last negative battery plate. The $N_1$ dispenser 22, P dispenser 26, and the $S_1$ and $S_2$ dispensers 24 and 28 all operate simultaneously to dispense plates and separators on conveyor 12. As shown in FIG. 1 as the plates are dispensed books of plates and separators 35 will be formed on conveyor 12. Each book 35 will comprise a partial battery element having a first negative or $N_1$ on the bottom, a first or $S_1$ separator, a positive or P plate and a second or $S_2$ separator all on top of the $N_1$ plate. A sufficient number of books when stacked together and capped by a last negative plate form a battery element (not shown). For example, a seven plate battery element would comprise three books 35. Each of the books would contain one $N_1$ plate and one P plate. A last negative or LN plate would be placed on top of the three books to form an element. It will thus be appreciated that the LN dispensing station 30 will be actuated only one-third as often as the remaining dispensing stations 22, 24, 26 and 28. Apparatus which accomplish the foregoing stacking procedure are well known in the art and accordingly the foregoing brief description will suffice.

Figure 2:
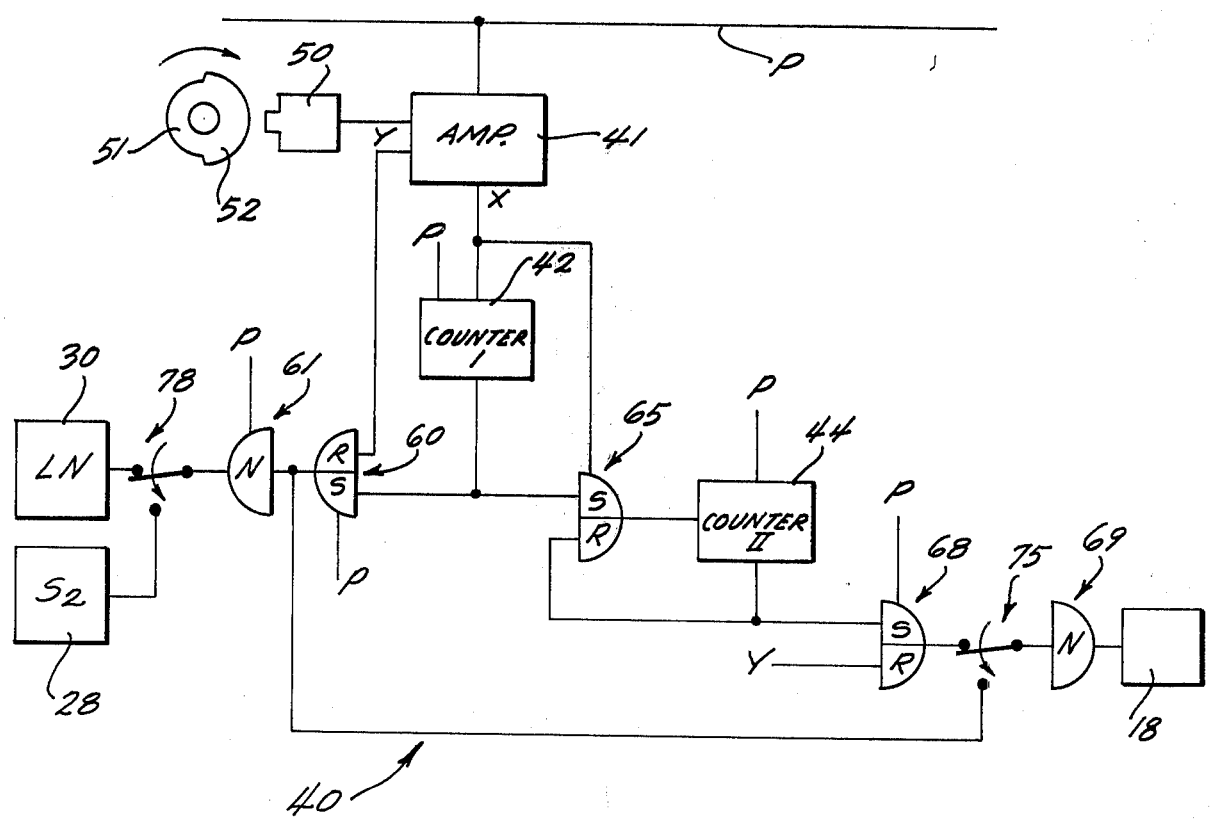
FIG. 2 is a logic diagram of an electrical control system according to the present invention.

Referring now to FIG. 2, an electrical control system 40 is depicted which is suitable for controlling the dispensing of battery plates and separators in a stacking apparatus as described relative to FIG. 1. The control system 40 generally includes an amplifier 41 for delivering output signals to a first counter 42 used to control the last negative or LN dispenser 30, and to a second counter 44 which is utilized to control the actuation of the kicker 18 for transporting battery elements to the output conveyor 20. The amplifier 41 receives signals from a detector 50 which may be a proximity type detecting device mounted adjacent to a rotating cam 51. The cam 51 completes one revolution for every complete cycle of the dispensing apparatus 10 shown in FIG. 1. Thus, as cam 51 rotates, a cam lobe portion 52 activates the proximity detector 50 which signals amplifier 41. The amplifier 41 has two outputs designated as X and Y. The X output occurs during the input pulses from the detector 50 and comprises a square wave output signal which is directed to the first counter 42. After a preselected number of input pulses, counter 42 will generate an output pulse which is directed to a first or LN retentive memory module 60. The signal from counter 42 is directed to the set side of LN module 60 which sends an output signal to a LN static switch 61 which in turn activates the last negative dispenser 30. Immediately after the output signal from counter 42 sets the LN module 60, and within the same operating cycle, a negative square wave from output Y of amplifier 41 resets the LN module 60 so that it is no longer operative until it receives another signal from the counter 42. The output of counter 42 is also connected to the set side of a second retentive memory or counter module 65 which also receives the X output pulses from amplifier 41. The output of the counter module 65 is directed to the second counter 44. Once the counter module 65 is set by the signal from the first counter 42, each X output pulse from amplifier 41 will send a corresponding pulse to the second counter 44. After a predetermined number of X pulses are received by the second counter 44, an output signal is sent to the set side of a third retentive memory or kicker module 68 which directs a signal to a kicker static switch 69 which in turn activates the kicker 18. The output pulse from counter 44 also acts to reset the counter module 65. Furthermore, after the kicker module 68 is set by the output pulse of counter 44 and activates kicker switch 69, it is immediately reset by a negative square wave pulse Y from amplifier 41.

A bypass switch 75 may be provided in the line between the kicker module 68 and kicker switch 69 for disconnecting counter 44 and for coupling the signal from the LN module 60 to kicker switch 69 so that the kicker 18 may be operated simultaneously with the LN dispenser 30. A mode switch 78 is provided at the output of LN switch 61 for disconnecting the output of the LN switch 61 from the last negative dispenser 30 and coupling the output of the LN switch 61 to the $S_2$ separator dispenser 28. Mode switch 78 is provided in the event that battery elements having an even number of positive and negative plates are desired as will be described hereinafter. A suitable power source P may be provided for providing power to the amplifier 41, counter 42 and 44, memory modules 60, 65, 68 and static switches 61 and 69. Activation of the kicker 18, $S_2$ separator dispenser 28 and LN dispenser 30 may be provided by suitable solenoids and/or mechanical connections as is well known in the art.

OPERATION

The operation of the control system will now be explained with reference to both FIGS. 1 and 2. For the sake of illustration it will be assumed that a nine plate battery element is to be formed on the stacking apparatus 10. This will require four books 35 of two plates, a positive and a negative, topped by one last negative or LN plate. Since the arrangement shown in FIG. 1 provides a continuous formation of books containing two plates due to the simultaneous operation of dispensers 22, 24, 26 and 28, it will be appreciated that to form a nine plate battery element every fourth book will require an LN plate. Therefore, the first counter 42, will be set to provide an output signal after four pulses from amplifier 41. During periods of continuous operation of the stacking apparatus 10, every fourth cycle will result in a disposition of books 35 as pictured in FIG. 1. That is, the first book 35a will have progressed to the kicker 18, the second book 35b will be in transfer on the transfer apparatus 16, the third book 35c will be in place on the holding station 14 and the fourth book 35d beneath the LN dispenser 30 will receive a last negative plate. Obviously, at this point in time it will be apparent that the kicker 18 should not be actuated until the fourth book 35d under last negative dispenser 30 has been transferred along with the second and third books 35b and 35c onto the first book 35a on the kicker 18. This will require three counts or cycles after disposition of the LN plate on the fourth book 35d. During the first count, the second book 35b will be transferred onto the first book on kicker 18, the third book 35c will be transferred from holding station 14 to the transfer apparatus 16 and the fourth book 35d containing the last negative will be transferred to holding station 14. At the second count after the LN has been dispensed, the third and fourth books 35c and 35d will advance again and at the third count a completed battery element will be in place on kicker 18. The element will then be ready for transfer from kicker 18 to the output conveyor 20. Therefore, the second counter 44, which is set by the output pulse of the first counter 42 through counter module 65, must be set to activate kicker 18 after the third count to transfer the element from kicker 18 and clear the kicker for receipt of successive books in a similar manner. The first output pulse from counter 42 after receipt of four counts sets both the LN and the counter modules 60 and 65. LN module 60 immediately activates LN switch 61 and dispenses the last negative from dispenser 30. The counter module 65, however, simultaneously receives an output pulse from output X of amplifier 41 upon being set by counter 42 and successive pulses from the output X are directed from the memory module 65 to the second counter. After three such pulses are received by second counter 44, the kicker module 68 is set and immediately activates kicker switch 69 which in turn activates kicker 18. At this point, the output from the second counter 44 also resets counter module 65 which is then ready to repeat the cycle. From the foregoing it will be apparent that in the formation of odd plate battery elements, counter 42 is set to dispense the LN plate from dispenser 30 only after a sufficient number of books have been formed. Counter 44 is adjusted to activate the kicker 18 after a sufficient number of counts have been received which indicate that a completed battery element is in place on kicker 18. Obviously the number of counts in each case will vary with the selected number of books in the desired battery element.

It will thus be appreciated that the control system 40 provides a great deal of flexibility in the number of plates contained in a battery element which is formed by the stacking apparatus 10. In certain cases, such as the formation of battery elements containing three plates or those containing seven plates, a completed battery element will be present on kicker 18 each time a last negative plate is dispensed by the dispenser 30. In such instances kicker 18 is actuated simultaneously with the dispensing of the last negative from dispenser 30. To handle this situation, bypass switch 75 is provided for bypassing counter 44 and for coupling kicker switch 69 directly to the output of the LN module 60 as seen in FIG. 2. Counter 42 is set to activate the last negative dispenser after an appropriate number of counts, i.e. either one or three, and immediately upon activating LN module 60 the module output simultaneously activates LN switch 61 and kicker switch 69 so that both the LN dispenser 30 and kicker 18 operate simultaneously.

The versitility of the present system is also adaptable to the manufacture of battery elements containing an equal number of positive and negative battery plates. In such cases the last negative plate is not required nor is the $S_2$ separator on the top of the last book of such a battery element. To adapt the system to produce even numbered elements mode switch 78 is provided between LN switch 61 and the LN dispenser 30. Mode switch 78 permits the LN dispenser 30 to be disconnected and LN switch 61 coupled to a circuit connected to the $S_2$ separator dispenser 28. The output of static switch 61 may be directed to a suitable assembly (not shown) for deactivating the $S_2$ dispenser 28. In all other respects the system will function as previously described. That is, books 35 will be formed in a conventional manner with the first counter 42 set to provide an output signal at the appropriate time at which the $S_2$ separator is to be deleted. Similarly the second counter 44 is set to activate kicker 18 whenever a completed battery element is in place on kicker 18. The only variation is that the system 40, instead of activating the normally non-functioning last negative dispenser 30, will now provide for deactivation of the normally functioning $S_2$ separator dispenser 28.

While a preferred embodiment of the control system has thus been described, it will be readily apparent to those skilled in the art that various equivalents are possible. For example, latching relays could be provided in place of the memory modules and conventional contact type switches could be utilized in place of the static switches. The detector 50 has been described as a proximity type sensor in connection with a rotating cam, however, any suitable signal generating device which is responsive to the cycling of the stacking apparatus 10 could be provided. For example, detector 50 and amplifier 41 could be replaced with conventional switches. Similarly, the stacking apparatus 10 has been generally described as including a holding station 14, transfer station 16, and kicking station 18, however, other stacking devices may provide more or lesser numbers of stations between the last negative dispensing point and the transfer point to an output device such as conveyor 20. The system is easily adapted to such devices by merely adjusting the settings on the first and second counters 42 and 44. Accordingly, the scope of the invention is not to be limited by the foregoing description but is to be taken solely by an interpretation of the claims which follow.

I claim:
1. An electrical control system for controlling a battery plate stacking apparatus which includes a plurality of battery plate and separator dispensers for continuously forming books of battery plates and separators, a station for accumulating at least one book to form a battery element, and a shuttle device for transferring the battery element for further processing, the control system comprising:
   first counter means for determining the number of cycles of operation of the stacking apparatus and means responsive to said first counter means for controlling the disposition of the last plate or separator of the battery element, and
   second counter means for determining the number of books accumulated at said station and means responsive to said second counter means for actuating the shuttle device after a preselected number of books sufficient to form a battery element have been accumulated.

2. An electrical control system as defined in claim 1 including first memory means coupled to the first counter means for activating a battery plate dispenser responsive to an output signal from the first counter for depositing an additional battery plate on one of the books.

3. An electrical control system as defined in claim 2 including bypass switch means coupled to the second counter means and having a first position wherein an output signal from the second counter actuates the shuttle device, and a second position wherein an output signal from the first counter means actuates the shuttle device.

4. An electrical control system as defined in claim 3, including detector means coupled to the stacking apparatus and responsive to an operating cycle of the stacking apparatus for providing a corresponding signal to the first counter means.

5. An electrical control system as defined in claim 4, including amplifier means for amplifying the signal from the detector means to the first counter means.

6. An electrical control system as defined in claim 1 including first memory means coupled to the first counter for controlling the disposition of the last plate or separator on the battery element, and second memory means disposed between the first and second counter means for activating the second counter means responsive to an output signal from the first counter means.

7. An electrical control system as defined in claim 6 including third memory means coupled to the second counter means for actuating the shuttle device after receiving an output signal from the second counter means, and wherein the output from the second counter means resets the second memory means.

8. An electrical control system as defined in claim 7, including detector means coupled to the stacking apparatus and responsive to an operating cycle of the stacking apparatus for providing a corresponding signal to the first counter means.

9. An electrical control system as defined in claim 8, including amplifier means for amplifying the signal from the detector means to the first counter means.

10. An electrical control system as defined in claim 6 including bypass switch means coupled to the first and second counter means and having a first position wherein an output signal from the second counter actuates the shuttle device, and a second position wherein an output signal from the first counter means actuates the shuttle device.

11. An electrical control system as defined in claim 1 including a mode switch coupled to the first counter means, the mode switch having a first position wherein an output signal from the first counter means is coupled to a plate dispenser for actuating the plate dispenser, and a second position wherein an output signal from the first counter means is coupled to a separator dispenser for deactivating the separator dispenser to prevent depositing of a separator on one of the books.

12. An electrical control system as defined in claim 11 including first memory means coupled to the first counter for controlling the disposition of the last plate or separator of the battery element, and second memory means disposed between the first and second counter means for activating the second counter means responsive to an output signal from the first counter means.

13. An electrical control system as defined in claim 12 including third memory means coupled to the second counter means for actuating the shuttle device after receiving an output signal from the second counter means, and wherein the output from the second counter means resets the second memory means.

14. An electrical control system as defined in claim 1 including first memory means coupled to the first counter means for preventing actuation of a separator dispenser responsive to an output signal from the first counter for deleting a separator from one of the books.

15. An electrical control system as defined in claim 14 including bypass switch means coupled to the second counter means and having a first position wherein an output signal from the second counter actuates the shuttle device, and a second position wherein an output signal from the first counter means actuates the shuttle device.

16. An electrical control system as defined in claim 15 including first memory means coupled to the first counter for controlling the disposition of the last plate or separator on the battery element, and second memory means disposed between the first and second counter means for activating the second counter means responsive to an output signal from the first counter means.

17. An electrical control system as defined in claim 16 including third memory means coupled to the second counter means for actuating the shuttle device after receiving an output signal from the second counter means, and wherein the output from the second counter means resets the second memory means.

18. An electrical control system as defined in claim 1, including detector means coupled to the stacking apparatus and responsive to an operating cycle of the stacking apparatus for providing a corresponding signal to the first counter means.

19. An electrical control system as defined in claim 18, including amplifier means for amplifying the signal from the detector means to the first counter means.

* * * * *